(12) United States Patent
Garcia et al.

(10) Patent No.: US 9,026,506 B2
(45) Date of Patent: May 5, 2015

(54) SYSTEM AND METHOD FOR MULTI-RESIDUE MULTIVARIATE DATA COMPRESSION

(71) Applicants: Oscar N. Garcia, Denton, TX (US); Shengli Fu, Denton, TX (US); Jyothy Melaedavattil Jaganathan, Denton, TX (US)

(72) Inventors: Oscar N. Garcia, Denton, TX (US); Shengli Fu, Denton, TX (US); Jyothy Melaedavattil Jaganathan, Denton, TX (US)

(73) Assignee: University of North Texas, Denton, TX (US)

(*) Notice: Subject to any disclaimer, the term of this patent is extended or adjusted under 35 U.S.C. 154(b) by 228 days.

(21) Appl. No.: 13/854,852

(22) Filed: Apr. 1, 2013

(65) Prior Publication Data

US 2013/0262414 A1 Oct. 3, 2013

Related U.S. Application Data

(60) Provisional application No. 61/619,319, filed on Apr. 2, 2012.

(51) Int. Cl.
*G06F 17/30* (2006.01)
*H03M 7/30* (2006.01)

(52) U.S. Cl.
CPC ....................... *H03M 7/30* (2013.01)

(58) Field of Classification Search
USPC ........................................................ 707/693
See application file for complete search history.

(56) References Cited

U.S. PATENT DOCUMENTS

| 4,281,391 | A | * | 7/1981 | Huang | 708/491 |
|---|---|---|---|---|---|
| 5,008,668 | A | * | 4/1991 | Takayama et al. | 341/83 |
| 5,117,383 | A | * | 5/1992 | Fujita et al. | 708/491 |
| 6,493,637 | B1 | * | 12/2002 | Steeg | 702/19 |
| 8,139,764 | B2 | * | 3/2012 | Chester et al. | 380/28 |
| 2004/0111459 | A1 | * | 6/2004 | Stojancic | 708/491 |

* cited by examiner

*Primary Examiner* — Noosha Arjomandi
(74) *Attorney, Agent, or Firm* — Jackson Walker L.L.P.

(57) ABSTRACT

A method for encoding data comprising generating a table having N moduli, where N is a positive integer equal to two or more, where each of a plurality of integers has a unique set of residue values associated with the moduli. Storing or transmitting the first data field value of a sequence of L data fields values, where L is an integer equal to or greater than 2. Storing or transmitting a set of K residue values, where K<N, for each of the successive L−1 data field values of the sequence of M data field values until a set of K residue values for each successive data field value have been stored. Retrieving or receiving the first data field value and the L−1 sets of K residue values. Reconstructing the sequence of L data fields using the multi-residue multivariate encoding table and a table look-up process, using the first value and the L−1 sets of K residue values.

20 Claims, 4 Drawing Sheets

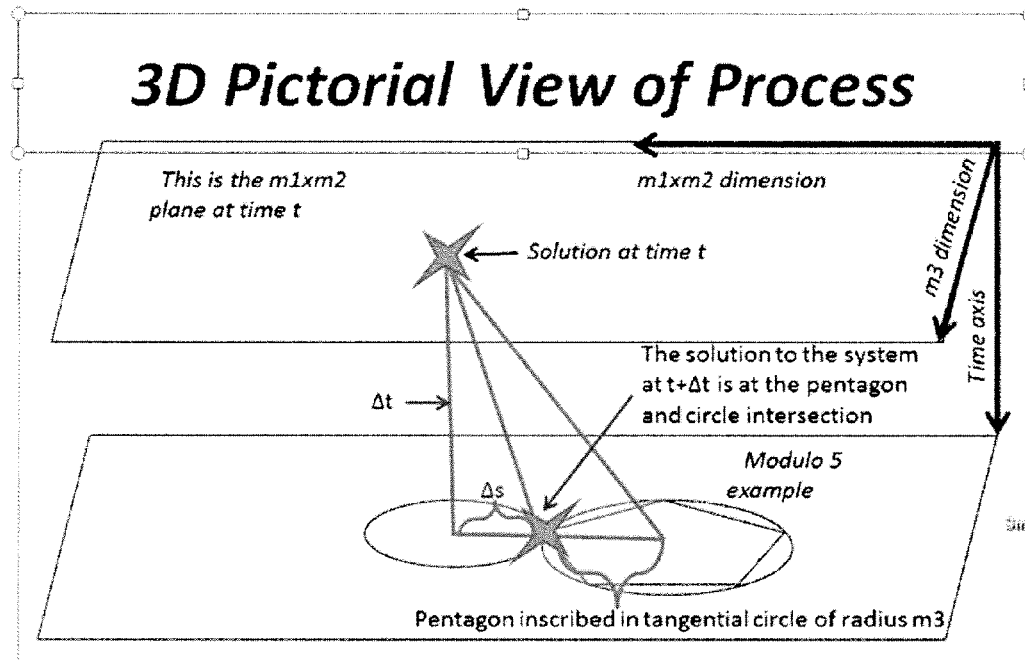
FIGURE 1    100
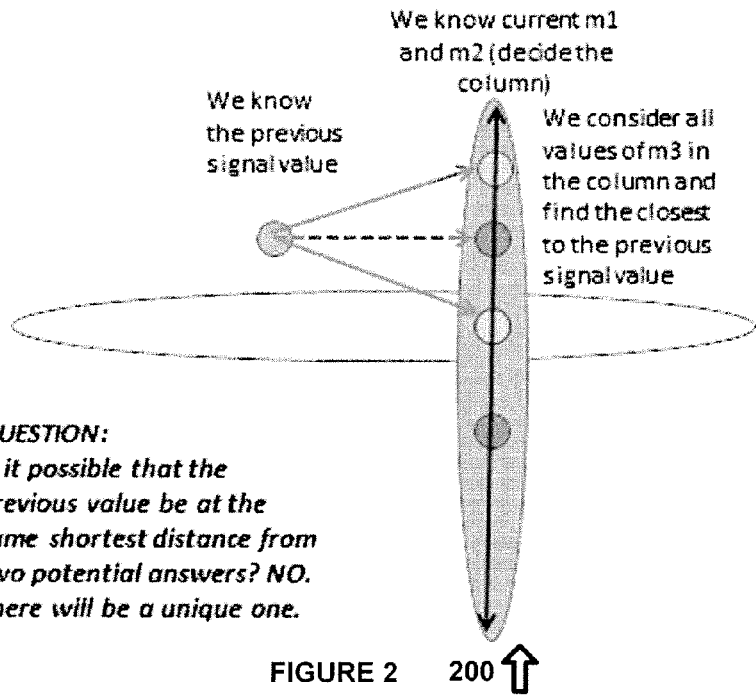
FIGURE 2    200

SYSTEM AND METHOD FOR MULTI-RESIDUE MULTIVARIATE DATA COMPRESSION

RELATED APPLICATIONS

This application claims benefit of U.S. provisional patent application 61/619,319, filed Apr. 2, 2012, entitled "SYSTEM AND METHOD FOR MULTI-RESIDUE MULTIVARIATE DATA COMPRESSION," which is hereby incorporated by reference for all purposes as if set forth herein.

TECHNICAL FIELD

The present disclosure pertains generally to data compression, and more specifically to a system, hardware implementation, and method for data compression that utilize multi-residue multivariate algorithmic processing and/or semiconductor logic processing.

BACKGROUND OF THE INVENTION

There are numerous data compression and encoding algorithms that are known in the art. Each of these different algorithms has unique aspects that makes it difficult to apply implementation aspects for one algorithm to the implementation of another algorithm.

SUMMARY OF THE INVENTION

A method for encoding data is disclosed that includes generating a table having N relatively prime moduli, where N is a positive integer equal to two or more, where each of a plurality of integers has a unique set of residue values associated with the moduli. To encode the data without any error but that of quantization, known as "lossless encoding", a first data field value of a sequence of L data fields values is stored or transmitted, where L is an integer equal to or greater than 2. A set of K residue values after the first data value is stored or transmitted for each of the successive L−1 data field values of the sequence of L data field values until a set of K residue values for each successive data field value has been stored, where K<N. To decode the data, the first data field not-encoded exact value and the L−1 sets of K residue values are retrieved. The sequence of L data fields is reconstructed using the multi-residue multivariate encoding table and a table look-up process, using the first exact value and the L−1 sets of K residue values.

Other systems, choices of moduli, equations and tables, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views, and in which:

FIG. 1 is a pictorial description of an exemplary decoding process where planes at time t and t+$\alpha_r$ for consecutive signal samples are shown;

FIG. 2 is an illustration of a search for the smallest difference between a known m3 residue of a previous sample and next-sample values in any one given column of different numbers that yields a unique shortest distance (difference between the signal decoded by K moduli and the previous signal, both less than the product of all the moduli, such M=m1*m2 for K=2) from the previous solution to the column if a table is used of the pair ($|x1|_{m1}$, $|x2|_{m2}$) as an illustration in the case of two moduli;

DETAILED DESCRIPTION OF THE INVENTION

Figure 3:
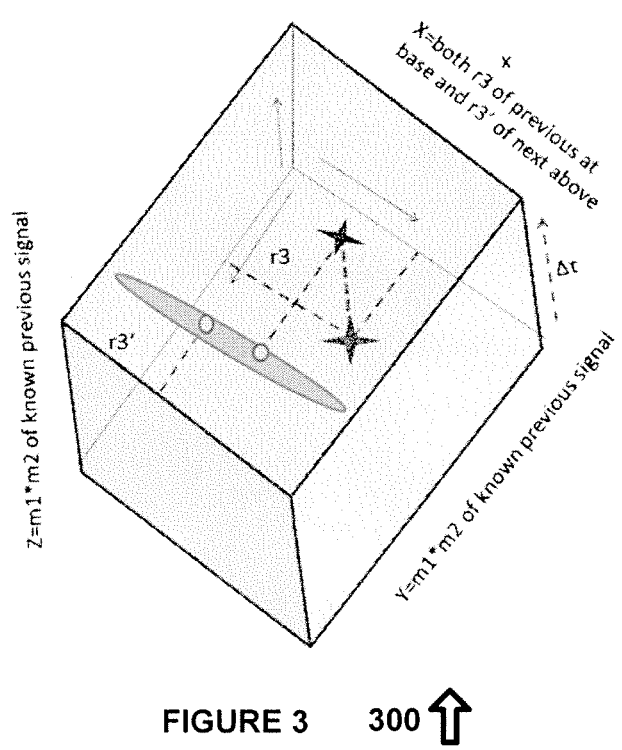
FIG. 3 is a diagram showing a function ms3D(m1, m2, m3) with moduli m1=3, m2=5 and m3=7 to generate a 7×15×15 matrix when a direct access to the decoded signal indexed by three moduli is used instead of searching for speed-up implementation.

In the description that follows, like parts are marked throughout the specification and drawings with the same reference numerals. The drawing figures might not be to scale and certain components can be shown in generalized or schematic form and identified by commercial designations in the interest of clarity and conciseness.

The disclosed data compression process is based on multiple residue encoding. As few as three remainders can be used to encode/compress the data. Prime moduli of type 2n−1 such as (7, 31, 127) have advantages but any other suitable numbers that are relatively prime composite integers can be used.

The signal is encoded by the remainder of the moduli which are chosen to achieve compression. Compression is accomplished by omitting at least one of the residues in the compressed transmitted or stored compressed message or field sequence. The decode/expansion is lossless provided the signal is bounded in amplitude by the moduli's product and values. Decoding/expansion can be done by selecting the value of the encoded signal that is arithmetically closest to the previous signal value. The selection (decoding) done is based on the value of a remainder of the amplitude of the known previous signal and on the transmitted or stored residues (such as 7 and 31 in one exemplary embodiment, assuming that 127 is used as the compression residue). The mentioned residues narrow down the possible values of the missing remainder. If the maximum peak to peak amplitude of the signal is less than the product of all the selected moduli (such as less than 7*31*127=27,559 in the exemplary embodiment) and the differential between adjacent samples stays below the production of the transmitted residues, we can guarantee uniqueness of the selected value. This implies lossless compression except for the unavoidable quantization error which is insignificant in practice. Likewise, two moduli (like M1=127 and M2=7*31) or other composite integers can be used, as long as they are pairwise prime. The nearest value to the previous signal in time is the one to give the correct answer to the solution of the next signal value in time under the given assumptions when considering all possible solutions of the system of congruencies for all the possible missing residues in the procedure. For example, let $m_i$ be moduli (to be specified later). A bounded positive signal, $s(t) \le \pi m_i$ for all t, is the signal that is to be sampled and quantized as an integer s(r) and expressed in multi-residue form in an n-dimensional hyper-parallelepiped of integers $\{i\}=\{1, 2, \ldots m_i\}$ along each integer i of the n dimensions at time t. If this signal changes in t+Δt time to the integer-quantized value $s(r+\Delta_r)$ which is a fortiori less than $\pi m_i$, and where r and $\Delta_r$ are integers and the set of remainders of the compression modulus, {j} is a proper subset of {i}. Then the closest value of each component of |s(r)| modulo $\pi m_j$ to $|s(r+\Delta_r)|$ modulo $m_k$ for each component in $\{k\}=\{i\}-\{j\}$ is the new value:

$$s(r+\Delta_t) = |s(r)| + \Delta_s | \text{modulo} \, m_k \quad (1)$$

This theorem can be proven as follows. Given a signal sample quantized as a non-negative integer $N < \pi m_i$ as specified above for the set of moduli, the multi-residue representation of N is $[|N|_{m1}, |N|_{m2}, \ldots |N|_{mn-1}, |N|_{mn}]$. Because of the circular linearity of the multi-residue bounded addition, the representation of $|N+\Delta|_{\pi mi} = N+\Delta$ is unique because the signal is bounded and the result of any sample to sample increment Δ is $N+\Delta < \pi m_i$. The multi-residue representation of this result is:

$$[|N+\Delta|_{m1}, |N+\Delta|_{m2} \ldots |N+\Delta|_{mn-1}, |N|_{mn}] \quad (2)$$

and (2) justifies (1).

The following is the encoding of the integers 0 to 104 (fourth column) modulo 3, 5 and 7 in the respective first three columns, in accordance with the disclosed process:

| Modulo: | | | |
| --- | --- | --- | --- |
| 3 | 5 | 7 | encoded number |
| 1 | 1 | 1 | 1 |
| 2 | 2 | 2 | 2 |
| 0 | 3 | 3 | 3 |
| 1 | 4 | 4 | 4 |
| 2 | 0 | 5 | 5 |
| 0 | 1 | 6 | 6 |
| 1 | 2 | 0 | 7 |
| 2 | 3 | 1 | 8 |
| 0 | 4 | 2 | 9 |
| 1 | 0 | 3 | 10 |
| 2 | 1 | 4 | 11 |
| 0 | 2 | 5 | 12 |
| 1 | 3 | 6 | 13 |
| 2 | 4 | 0 | 14 |
| 0 | 0 | 1 | 15 |
| 1 | 1 | 2 | 16 |
| 2 | 2 | 3 | 17 |
| 0 | 3 | 4 | 18 |
| 1 | 4 | 5 | 19 |
| 2 | 0 | 6 | 20 |
| 0 | 1 | 0 | 21 |
| 1 | 2 | 1 | 22 |
| 2 | 3 | 2 | 23 |
| 0 | 4 | 3 | 24 |
| 1 | 0 | 4 | 25 |
| 2 | 1 | 5 | 26 |
| 0 | 2 | 6 | 27 |
| 1 | 3 | 0 | 28 |
| 2 | 4 | 1 | 29 |
| 0 | 0 | 2 | 30 |
| 1 | 1 | 3 | 31 |
| 2 | 2 | 4 | 32 |
| 0 | 3 | 5 | 33 |
| 1 | 4 | 6 | 34 |
| 2 | 0 | 0 | 35 |
| 0 | 1 | 1 | 36 |
| 1 | 2 | 2 | 37 |
| 2 | 3 | 3 | 38 |
| 0 | 4 | 4 | 39 |
| 1 | 0 | 5 | 40 |
| 2 | 1 | 6 | 41 |
| 0 | 2 | 0 | 42 |
| 1 | 3 | 1 | 43 |
| 2 | 4 | 2 | 44 |
| 0 | 0 | 3 | 45 |
| 1 | 1 | 4 | 46 |
| 2 | 2 | 5 | 47 |
| 0 | 3 | 6 | 48 |
| 1 | 4 | 0 | 49 |
| 2 | 0 | 1 | 50 |
| 0 | 1 | 2 | 51 |
| 1 | 2 | 3 | 52 |
| 2 | 3 | 4 | 53 |
| 0 | 4 | 5 | 54 |
| 1 | 0 | 6 | 55 |
| 2 | 1 | 0 | 56 |
| 0 | 2 | 1 | 57 |
| 1 | 3 | 2 | 58 |
| 2 | 4 | 3 | 59 |
| 0 | 0 | 4 | 60 |
| 1 | 1 | 5 | 61 |
| 2 | 2 | 6 | 62 |
| 0 | 3 | 0 | 63 |
| 1 | 4 | 1 | 64 |
| 2 | 0 | 2 | 65 |
| 0 | 1 | 3 | 66 |
| 1 | 2 | 4 | 67 |
| 2 | 3 | 5 | 68 |
| 0 | 4 | 6 | 69 |
| 1 | 0 | 0 | 70 |
| 2 | 1 | 1 | 71 |
| 0 | 2 | 2 | 72 |
| 1 | 3 | 3 | 73 |
| 2 | 4 | 4 | 74 |
| 0 | 0 | 5 | 75 |
| 1 | 1 | 6 | 76 |
| 2 | 2 | 0 | 77 |
| 0 | 3 | 1 | 78 |
| 1 | 4 | 2 | 79 |
| 2 | 0 | 3 | 80 |
| 0 | 1 | 4 | 81 |
| 1 | 2 | 5 | 82 |
| 2 | 3 | 6 | 83 |
| 0 | 4 | 0 | 84 |
| 1 | 0 | 1 | 85 |
| 2 | 1 | 2 | 86 |
| 0 | 2 | 3 | 87 |
| 1 | 3 | 4 | 88 |
| 2 | 4 | 5 | 89 |
| 0 | 0 | 6 | 90 |
| 1 | 1 | 0 | 91 |
| 2 | 2 | 1 | 92 |
| 0 | 3 | 2 | 93 |
| 1 | 4 | 3 | 94 |
| 2 | 0 | 4 | 95 |
| 0 | 1 | 5 | 96 |
| 1 | 2 | 6 | 97 |
| 2 | 3 | 0 | 98 |
| 0 | 4 | 1 | 99 |
| 1 | 0 | 2 | 100 |
| 2 | 1 | 3 | 101 |
| 0 | 2 | 4 | 102 |
| 1 | 3 | 5 | 103 |
| 2 | 4 | 6 | 104 |
| 0 | 0 | 0 | 0 |

It should be noted that 105=3×5×7, and further noted that the result of any increment Δ that yields N(t)=N(t−1)+Δ must be less than 105, because the signal has been bounded to be no larger than 104. The description of the decoding process is pictorially shown in FIG. 1, where the planes at time t and t+$\Delta_t$ for consecutive signal samples are shown. The moduli and sample locations are provided for the illustrative purposes, and as an example of a general case but other suitable moduli may also or alternatively be used in an application.

Furthermore it is not necessary to use the Chinese Remainder Theorem (CRT) or any other similar congruence-solving algorithm, because it is possible to utilize a faster table-look up or a suitable formula that can be used to try the range of possible solutions for of any other suitable $m_i$), given that the other residues are available for decoding. There is a general algorithm for the computation of such a table that, given a set of moduli, constructs the solution for a complete set of residues. This algorithm is provided below in the Matlab language for the three exemplary small moduli, but the algorithm works for any suitable three moduli, and may likewise be expanded to accommodate more or fewer moduli as long as they have gcd (greatest common divisors) equal to one.

```
m3=7;
m2=3;
m1=5;
k=m1*m2;
t=k*m3;
a(1,1)=1;
for i=2:m3
    a(i,1)=a(i-1,1)+k;
end
col=1;
for i=2:k
    a(1,col+1)=mod((a(m3,col)+1),t);
    for j=2:m3
        a(j,i)=mod((a(j-1,i)+k), t);
    end
    col=col+1;
end
a
```

This exemplary algorithm yields the following Table I for fast look-up and ease of addressing in hardware:

TABLE I

Resulting from the table-creation program m3, (m2, m1)<->x, (y, z)
Y - (m1 = 3) * (m2 = 5) dimension (known)
X - (M3 = 7) (dimension being estimated)

| X | 11 | 22 | 03 | 14 | 20 | 01 | 12 | 23 | 04 | 10 | 21 | 02 | 13 | 24 | 00 |
|---|----|----|----|----|----|----|----|----|----|----|----|----|----|----|----|
| 1 | 1  | 92 | 78 | 64 | 50 | 36 | 22 | 8  | 99 | 85 | 71 | 57 | 43 | 29 | 15 |
| 2 | 16 | 2  | 93 | 79 | 65 | 51 | 37 | 23 | 9  | 100| 86 | 72 | 58 | 44 | 30 |
| 3 | 31 | 17 | 3  | 94 | 80 | 66 | 52 | 38 | 24 | 10 | 101| 87 | 73 | 59 | 45 |
| 4 | 46 | 32 | 18 | 4  | 95 | 81 | 67 | 53 | 39 | 25 | 11 | 102| 88 | 74 | 60 |
| 5 | 61 | 47 | 33 | 19 | 5  | 96 | 82 | 68 | 54 | 40 | 26 | 12 | 103| 89 | 75 |
| 6 | 76 | 62 | 48 | 34 | 20 | 6  | 97 | 83 | 69 | 55 | 41 | 27 | 13 | 104| 90 |
| 0 | 91 | 77 | 63 | 49 | 35 | 21 | 7  | 98 | 84 | 70 | 56 | 42 | 28 | 14 | 0  |

This matrix preserves the equidistant column properties when columns are exchanged or circularly rotated. Based on this observation, Table I can further be organized as follows as equivalent two dimensional examples shown in Table II. The first (top one) of these two examples will be described and chosen because it enables simpler encoding and decoding relative to the second.

TABLE II

Reorganized Table I with two equivalent contents

| 1  | 2  | 3  | 4  | 5  | 6  | 7  | 8  | 9  | 10 | 11 | 12 | 13 | 14 | 15 |
|----|----|----|----|----|----|----|----|----|----|----|----|----|----|----|
| 16 | 17 | 18 | 19 | 20 | 21 | 22 | 23 | 24 | 25 | 26 | 27 | 28 | 29 | 30 |
| 31 | 32 | 33 | 34 | 35 | 36 | 37 | 38 | 39 | 40 | 41 | 42 | 43 | 44 | 45 |
| 46 | 47 | 48 | 49 | 50 | 51 | 52 | 53 | 54 | 55 | 56 | 57 | 58 | 59 | 60 |
| 61 | 62 | 63 | 64 | 65 | 66 | 67 | 68 | 69 | 70 | 71 | 72 | 73 | 74 | 75 |
| 76 | 77 | 78 | 79 | 80 | 81 | 82 | 83 | 84 | 85 | 86 | 87 | 88 | 89 | 90 |
| 91 | 92 | 93 | 94 | 95 | 96 | 97 | 98 | 99 | 100| 101| 102| 103| 104| 0  | or

| 0  | 21 | 42 | 63 | 84 | 70 | 91 | 7  | 28 | 49 | 35 | 56 | 77 | 98 | 14 |
|----|----|----|----|----|----|----|----|----|----|----|----|----|----|----|
| 15 | 36 | 57 | 78 | 99 | 85 | 1  | 22 | 43 | 64 | 50 | 71 | 92 | 8  | 29 |
| 30 | 51 | 72 | 93 | 9  | 100| 16 | 37 | 58 | 79 | 65 | 86 | 2  | 23 | 44 |
| 45 | 66 | 87 | 3  | 24 | 10 | 31 | 52 | 73 | 94 | 80 | 101| 17 | 38 | 59 |
| 60 | 81 | 102| 18 | 39 | 25 | 36 | 67 | 88 | 4  | 95 | 11 | 32 | 53 | 74 |
| 75 | 96 | 12 | 33 | 54 | 40 | 61 | 82 | 103| 19 | 5  | 26 | 47 | 68 | 89 |
| 90 | 6  | 27 | 48 | 69 | 55 | 76 | 97 | 13 | 34 | 20 | 41 | 62 | 83 | 104|

If $r_i=|x|_{mi}$ at time t and $r'_i=|x'|_{mi}$ at time t+Δt, then the value of an element c(i, j) in Table II may be expressed as:

$$C(i,j)=c((|r_1'^*r_2'|_{decimal}+(|r_1'^*r_2'|_{decimal}*m1m2)_{m1*m2}, r_3)$$

A faster implementation of this method can be accomplished by using a 3D table or by a formula. However the viability of Table II (upper content) by not requiring as much storage as the 3D table look-up method and the fact that it is simpler to encode and decode with it, makes it a good choice but not the only possible one for an exemplary implementation.

In one example, the Chinese Remainder Theorem implemented with Matlab ran for 490 seconds to reach a solution, whereas the table look-up took 15 seconds to reach a solution. The upper 2D table in the TABLE II example should be even faster, particularly in a hardware implementation of the algorithm thereby allowing real-time encoding and decoding.

The top row of Table I is the pair ($|x1|_{m1}$, $|x2|_{m2}$), which counts from 0 to 3×(0-5) in multi-residue format for those moduli equivalent to the decimal integers zero to fifteen. This pair of residues (or more likely a single residue of their product which is a residue modulo 15) is the part of the message that is stored, when the process is used for storing compressed data, and is the part of the message that is transmitted when the process is used for transmission of compressed data. Once the previous sample amplitude is subtracted from the column selected by the count, the minimum distance to the previous point of the m1×m2 dimension, which is the closest number in the column determined by modular arithmetic subtraction of the current from the previous value in the corresponding complete residue system. In general, a 2D table with composite (product of primes) moduli M1 and M2 can be used, as long as there is no common prime in the moduli, i.e. gcd(M1, M2)=1. Having composite moduli provides greater flexibility in the choice the moduli and enhances the opportunities to combine compression with encryption.

The search for the smallest difference between the known m3 residue of the previous sample and the next-sample values in any one given column of different numbers yields a unique shortest distance (difference modulo M) from the previous solution to the column of the pair ($|x1|_{m1}$, $|x2|_{m2}$), as illustrated in two dimensions in FIG. 2. This concept is extensible to higher dimensions, and allows the use of hardware implementation for real-time or near real-time decoding. The use of the upper table of the two (among many possible) variants shown in Table II avoids the search because the closest residue is on the same row as the row of the previous sample.

Once the 2D table is constructed, it is also possible to construct a symmetric matrix of distances between the rows, which are given by the (i, j) entry equal to distance between row i and row j, in 3 dimensions. This approach has the advantage of fast direct access but the disadvantage of requiring larger storage than the search method in the 2D table.

Given the value of the coordinates (m3, (m1*m2)) of the previous signal in the table, the column corresponding to current known column (r1'*r2') is searched or directed by a formula for its minimum distance. Given the three residue values of the previous sample, the (m1*m2) and m3 coordinates are projected onto the next sample plane and searched for the closest value of the m3' coordinate that yields the closest (least arithmetic distance) value to the column determined by the received residues r1' and r2' modulo m1 and m2. For a given m1 and m2 at time t, and the values of the moduli, if the signal is sufficiently continuous and bounded, the most likely residue r3' modulo m3 can be predicted. A three dimensional matrix may do this by addressing the residues ((m1*m2), (m1'*m2')) and obtaining m3' as the contents of that location, where the prime mark (') is used to differentiate between previous and current values, although the moduli might be the same values for the prime as the unprimed symbols when the signal does not change.

Combining the previous program as a MATLAB function with the 3D Table generator program for moduli m1, m2 and m3, the following program produces a 3D table "b":

```
function a,b = ms3D(m1,m2,m3)
%%Step 1 is to form a 2D table "a"
k=m1*m2;
t=k*m3;
a(1,1)=1;
for i=2:m3
    a(i,1)=a(i-1,1)+k;
end
col=1;
for i=2:k
a(1,col+1)=mod((a(m3,col)+1),t);
for j=2:m3
    a(j,i)=mod((a(j-1,i)+k), t);
end
col=col+1;
end
a
%% Step 2: Construct the 3-D table "b"
for ic = 1 : m1*m2
    for ir = 1 : m3
        % Locate the previous samples
        Pre_Sample = a(ir, ic);
        for iz = 1 : m1*m2
            % Find m3 possible values for the current sample
            Curr_Sample_Candi = a(:, iz);
            % Find the distance between current and previous
            dist = abs(Pre_Sample – Curr_Sample_Candi);
            [dummy idx] = min(dist);
            b(ir, ic, iz) = Curr_Sample_Candi(idx);
        end
    end
end
b
```

Calling the function ms3D(m1, m2, m3) with the previously used moduli m1=3, m2=5 and m3=7 can be used to generate a 7×15×15 matrix, which can be represented by the diagram shown in FIG. 3. As discussed above, the avoidance of the use of algorithms for solving the system of congruencies can be accomplished by properly addressing the contents of a 3D table. Therefore, the contents of the element P(X, Y, Z) can provide the value of r3' and uniquely determine, under these assumptions, the value of the decoded signal P'(r1', r2', r3') at time t+Δt. In this example, if P=68=[2, 3, 5] as can be verified from the multi-residue representation previously shown, when the transmitted values are r1=2, r2=2, then the closest value to 68 at t+Δt in the column (2, 2) is 62. A further assumption is that there is a Lipschitz-like condition that must be being satisfied. This is one of several possible methods to accomplish the encoding and decoding for the multi-residue approach to data compression.

The input signal (particularly if audio) is usually of small magnitude but amenable to amplification, where the amount of amplification is an issue of implementation. For example, a 0.1 volt signal coded in 16-bit samples would lose the significant bits in an integer representation, if not sufficiently amplified. Restrictions may also be imposed on the magnitude of the "amplified" signal, so as not to exceed m1*m2*m3 (or in general M1*M2 if a two composite moduli approach is used), to operate within the complete residue system set of values and not beyond. Similarly, the Δs of the signal going from any sample to the next must be bound by m1*m2 for analogous reasons. Under a "worst case" scenario where the maximum Δs that could occur is m1*m2 of magnitude equivalent to the peak-to-peak value. If the signal is amplified to comply with $\Delta s_{max}=p2p*k$, where k is the amplification factor after all samples are made positive for having lifted the signal by an amount y>y+min(y). While originally the dc (average) component of the signal was zero, it is now equal to the magnitude of the lift and $y_{min}=0$ now after lifting and amplifying.

A program that takes advantage of preserving the number of bits, according to the Matlab table of the format when the function wavread( ) is applied, is given after the table.

The range of values in y depends on the data format fmt specified. Some examples of output scaling based on typical bit-widths found in a WAV file are given below for both 'native' and 'double' formats.

| | Native Formats | |
|---|---|---|
| Number of Bits | MATLAB Data Type | Data Range |
| 8 | uint8 (unsigned integer) | 0 <= y <= 255 |
| 16 | int16 (signed integer) | −32768 <= y <= +32767 |
| 24 | int32 (signed integer) | −2^23 <= y <= 2^23 − 1 |
| 32 | single (floating point) | −1.0 <= y < +1.0 |

| | Double Formats | |
|---|---|---|
| Number of Bits | MATLAB Data Type | Data Range |
| N < 32 | double | −1.0 <= y < +1.0 |
| N = 32 | double | −1.0 <= y <= +1.0 |
| | | Note: Values in y might exceed −1.0 or +1.0 for the case of N = 32 bit data samples stored in the WAV file. |

The function wavread supports multi-channel data, with up to 32 bits per sample, and also supports Pulse-code Modulation (PCM) data format only, but other formats can be made amenable to compression also.

An algorithm that avoids the loss of significant bits in the input/output process is given below.

```
% Read the wav file
y_in = wavread('timi_in.wav');
figure
plot(y_in)
% Using the equation for scaling since the range is [−1 1]
k = (max(y_in) − min(y_in));
y = 2/k.*y_in;   % Assuming min negative
% figure
% plot(y)
% The Equation below makes all the sample values positive
y = (y/2) + 0.5;
% figure
% plot(y)
    % To digitize, divide [−1, 1) into 2^X levels using N bits.
% Generally N is either 8 or 16 bits.
% Assuming N = 8
N = 16;
dat = floor((2^(N−1) )* y);
% figure
% plot(dat)
% To convert to the required datatype
dat = uint16(dat);
% figure
% plot(dat)
%converting the signal back to original
dat = double(dat);
```

```
dat = dat / 2^(N−1);
dat = (dat − 0.5)*2;
dat = (k/2).*dat;
figure
plot(dat)
%Error calculation
err = y_in − dat;
%Calculating RMS error between input and output signals
err_rms = sqrt((sum(err.^2))/length(err));
fprintf('\nRMS error between input and output signals is %f', err_rms);
```

The validity of the least significant bits is questionable when the signal is processed and formats change in the software implementation of the basic algorithms. An ultimate eventual fixed point hardware (or software) implementation will solve this problem.

The mathematical solution of a system of congruencies is provided by the Chinese Remainder Algorithm, among other methods. It suffices that the moduli be pairwise relatively prime to obtain a solution. However, without loss of generality it is simpler to use prime moduli, for experimentation and possible applications, thereby avoiding having to check pairwise primality and the validity of inverses. The use of prime moduli, though, is a more restrictive condition than necessary. The disclosed embodiments extend to the use of both composite pairwise prime moduli as well as prime numbers as moduli. While three moduli have been used in the examples shown herein, the number of moduli may be two or greater of either pairwise prime or prime.

A factor (besides the added circuitry required for more than two moduli) to be taken into account in the selection of moduli and their relative distribution is discussed below. In the basic theorem, to have a complete residue system, the product of the moduli used must not be smaller than the largest value of the signal for unique representation. Whenever this requirement is satisfied but the product is close (just in case greater resolution were to be needed) to the upper bound of the largest signal value, numerical significance in the encoding is preserved.

Figure 4:
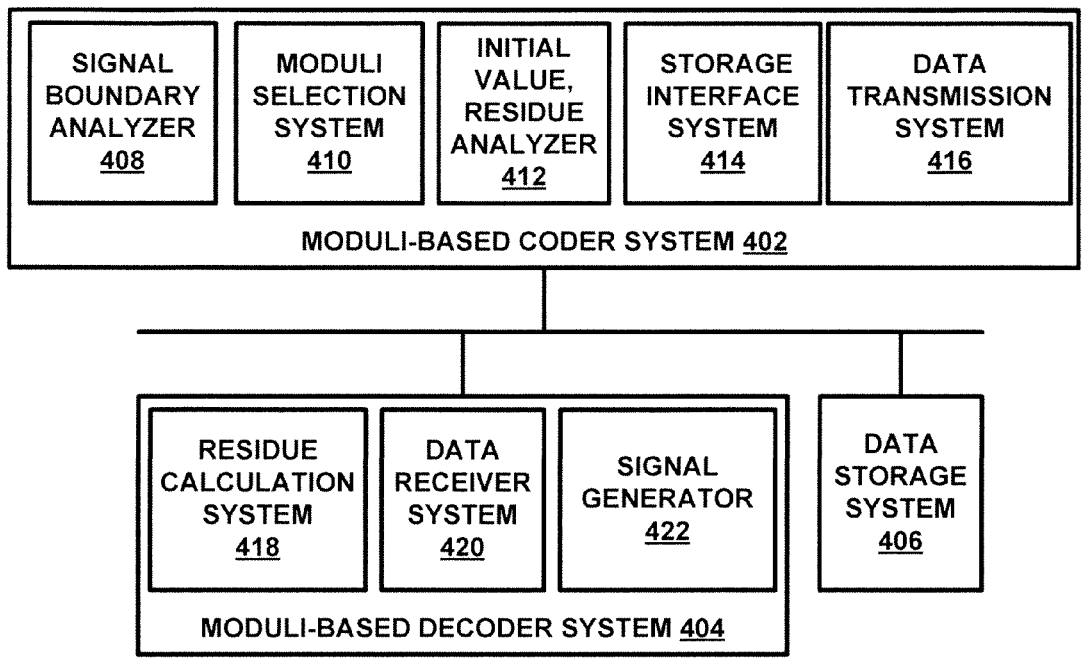
FIG. 4 is a diagram of a system for encoding and decoding data using multi-residue multivariate compression in accordance with an exemplary embodiment of the present disclosure.

FIG. 4 is a diagram of a system 400 for encoding and decoding data using multi-residue multivariate compression in accordance with an exemplary embodiment of the present disclosure. System 400 includes moduli-based coder system 402, moduli-based decoder system 404, data storage or buffer system 406, signal boundary analyzer 408, moduli selector system 410, initial value and residue analyzer 412, storage or buffer interface system 414, data transmission system 416, residue calculation system 418, data receiver system 420 and signal generator 422, each of which can be implemented in hardware or a suitable combination of hardware and software, and which can be one or more software systems operating on a processing platform. As used herein, "hardware" can include a combination of discrete components, an integrated circuit, an application-specific integrated circuit, a field programmable gate array, a general purpose processor, a parallel processor architecture, a massively-paralleled processor architecture, a digital signal processor or other suitable hardware. As used herein, "software" can include one or more objects, agents, threads, lines of code, subroutines, separate software applications, two or more lines of code or other suitable software structures operating in two or more software applications or on two or more processors, or other suitable software structures. In one exemplary embodiment, software can include one or more lines of code or other suitable software structures operating in a general purpose software application, such as an operating system, and one or more lines of code or other suitable software structures operating in a specific purpose software application.

Moduli-based coder system 402 receives data and encodes the data using multi-residue multivariate compression. In one exemplary embodiment, moduli-based coder system 402 utilizes the algorithms disclosed herein, either in the form of software-implemented algorithms operating on a suitable platform, such as a general purpose processor, a parallel processor or other suitable processors, or in the form of an application-specific integrated circuit or other suitable circuitry. Moduli-based coder system 402 receives data, compresses or encodes the data using two or more moduli, and transmits or stores the compressed or encoded data in a format that allows the compressed data to be subsequently expanded or decoded. Moduli-based coder system 402 can thus be used for a variety of applications, such as to compress audio data for storage or transmission, to compress audiovisual or other suitably changing data for storage or compression, to encrypt data for secured storage or transmission as part of the process, or for other suitable applications. These applications include storage or streaming of data for delivery over a network, streaming of audiovisual data for subsequent display on a television or video display, streaming of audio data for subsequent reproduction on speakers of a personal electronic device such as a telephone or musical device, storage or transmission of facsimiles, storage or transmission of still images, storage or transmission of large files of information, telecommunications, optical data transmission or storage, financial data transmission or storage, or other suitable applications.

Moduli-based decoder system 404 receives encoded or compressed data and decodes or expands the data using multi-residue multivariate decoding or decompression. In one exemplary embodiment, moduli-based decoder system 404 utilizes the algorithms disclosed herein, either in the form of software-implemented algorithms operating on a suitable platform, such as a general purpose processor, a parallel processor or other suitable processors, or in the form of an application-specific integrated circuit or other suitable circuitry. Moduli-based decoder system 404 can be utilized by personal computers, tablet computers, telephones, personal electronic devices, facsimile machines, televisions, stereo systems, financial data processing systems or other suitable devices.

Data storage system 406 receives encoded or compressed data for storage and provides the encoded or compressed data for use on demand. In one exemplary embodiment, data storage system 406 utilizes a multi-residue multivariate frame format for storage of encoded or compressed data.

Signal boundary analyzer 408 analyzes input data signals to determine a boundary for the input data signals and amplify or reduce the amplitude of the signal as it may be necessary for the application. In one exemplary embodiment, the input data signals may be in a format having variable boundaries that can dynamically change from a large range between a maximum and minimum value to a small range for a maximum and minimum value. In this exemplary embodiment, the use of the disclosed multi-residue multivariate encoding or compression processes can be optimized by selecting suitable moduli for the associated boundary conditions, such as to provide greater or lesser resolution, greater or lesser compression ratios, or other suitable parameters.

Moduli selector system 410 selects suitable moduli for use in a multi-residue multivariate encoding or compression process. In one exemplary embodiment, the moduli can be determined as a function of the input data source, such as where a predetermined data range and frame size is used. In another exemplary embodiment, moduli selector can receive boundary data for a signal from signal boundary analyzer 408 or other suitable systems and can select an optimal set of moduli for use with the associated boundary data. Moduli selector system 410 can analyze the boundary data or other suitable data in order to dynamically generate the associated moduli using the processes disclosed herein, can utilize a look-up table to select predetermined moduli, or can perform other suitable processing.

Initial value and residue analyzer 412 analyzes input data to generate initial value data and residue data in accordance with the processes disclosed herein. In one exemplary embodiment, initial value and residue analyzer 412 can select one or more initial frames, sets, sequences, strings, series or other data structure for use in calculation of the next transmitted value, based on the transmitted residue one of one of two or more moduli. Likewise, initial value and residue analyzer 412 can generate the residue values for the encoded or compressed data, so as to allow the encoded or compressed data to be decoded or expanded by moduli-based decoder system 404, using the processes described herein. In one exemplary embodiment, initial value and residue analyzer 412 can utilize one or more look-up tables to convert an input data value of a signal into one or more residue values that can be decoded and transmitted to moduli-based decoder system 404 and used to reproduce the input value based on the previous value of the signal.

Storage interface system 414 formats initial value and residue data for storage. In one exemplary embodiment, storage interface system 414 can assemble initial value moduli and residue values into a data frame or other suitable formats having a predetermined data structure, so as to allow the data to be stored and subsequently retrieved by moduli-based decoder system 404 or other suitable systems that can then decode or decompress the data back into the original signal. In another exemplary embodiment, storage interface system 414 can process data for storage in an optimal manner, such as by buffering or otherwise storing the data and then subsequently compressing the data in an optimal data storage format, such as where real-time storage of the data is not required, and where the optimal data storage format can be obtained by processing the data independent of any real-time data delivery requirements.

Data transmission system 416 formats moduli, initial value field and residue data for transmission. In one exemplary embodiment, data transmission system 416 can assemble moduli, initial value field and residue values into a data frame or other suitable formats having a predetermined data structure, so as to allow the data to be transmitted and subsequently received by moduli-based decoder system 404 or other suitable systems that can then decode or decompress the data back into the original signal. In another exemplary embodiment, storage interface system 414 can process data for real-time data transmission in an optimal manner, such as by processing the data in a manner that can result in a less than optimal compression ratio but which otherwise supports real-time transmission, by processing the data in a manner to optimize the data for dynamically changing bandwidth requirements, or in other suitable manners.

Residue calculation system 418 receives data that has been encoded or compressed using a multi-residue multivariate encoding or compression process and decodes or expands the data back to the original data signal, such as by using the disclosed processes and those that utilize the nature of the signal for compression using multi-residue compression and encryption. In one exemplary embodiment, residue calculation system 418 can receive initial values that include the entire data set for a frame, set, sequence, string, series or other data structure and a sequence of residue values and can calculate the next data value for each of the subsequent data structures, by using the subsequent associated sets of residue values. Residue calculation system 418 can apply each set of residue values to a look-up table, can perform calculations using the sets of residue values following formula or algorithmic processing, or can perform other suitable processing.

Data receiver system 420 can receive transmitted encoded or compressed data from a multi-residue multivariate encoding or compression process, can retrieve the encoded or compressed data from storage, or can otherwise interface with moduli-based coder system 402, data storage system 406 or other suitable systems to obtain data for subsequent processing.

Signal generator 422 receives decoded or decompressed data from residue calculation system 418 and assembles the data to generate the original data signal or structure. In one exemplary embodiment, signal generator 422 can generate an audio signal, an audiovisual signal, a facsimile signal, a telecommunications signal, a financial data signal or other suitable data signals or structures.

In operation, system 400 performs lossless compression or encoding of data using a multi-residue multivariate encoding or compression process, and subsequently expands or decodes the data for use at a remote location, at a different time, or for other suitable purposes. System 400 can utilize the processes for multi-residue multivariate encoding or compression as disclosed herein to realize a suitable lossless compression ratio. The compression ratio that can be achieved is defined by the size of the (transmitted residues of the encoded message minus one initial signal sample value)/(all residues encoded and recovered for each one of the files).

System 400 can also or alternatively be used for encryption of data. In one exemplary embodiment, the moduli used to encode the data can be dynamically modified and transmitted the same or in a separate encoded data channel, where the receiver utilizes the encoded moduli data to decode the received initial and residue values. Likewise, the moduli can be varied based upon a predetermined sequence that is stored by both the transmitter of the encrypted message and the message receiver. A separate code and codebook can be used to identify the moduli that have been used at any given time where the code is transmitted to the receiver for use in decoding the received residue values, or other suitable processes can also or alternatively be used to change dynamically the encoding. It is anticipated that in addition to numeric residues, products of irreducible polynomials can be utilized in both compression and encryption systems in a similar residue format by utilizing the same assumptions and principles, but this time applied to an extension Galois field modulo irreducible polynomials in addition to or in conjunction with the composite of ground arithmetic fields GF(p) of multivariate multi-residue arithmetic. This extension further enhances the encryption process.

Figure 5:
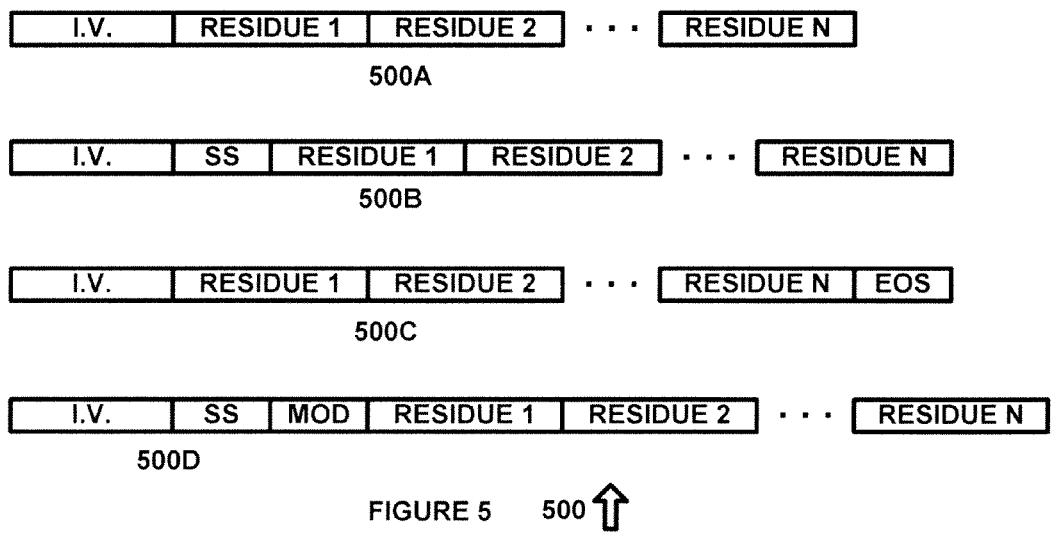
FIG. 5 is a diagram showing exemplary data frame formats in accordance with an exemplary embodiment of the present disclosure.

FIG. 5 is a diagram 500 showing exemplary data frame formats in accordance with an exemplary embodiment of the present disclosure. Data frame format 500A includes an initial value field followed by separate fields for residue 1 through residue N, where each field has a predetermined field size. In one exemplary embodiment, a data signal or other suitable data can be encoded in a predetermined number of frames, sets, sequences, strings, series or other suitable data structures, such as where the number of residues is predetermined. In this exemplary embodiment, the uncompressed value of the first data sample (called here an initial value field) is used to decode the second compressed sample. The omitted residues for subsequent data structures (not transmitted to achieve compression) are determined by the decoder using the disclosed multi-residue multivariate encoding or compression process.

Data frame format 500B includes a initial value field followed by a string size field SS and separate fields for residue 1 through residue N, where the number of residue fields N is contained within the string size field. In this exemplary embodiment, the number of residue fields for an associated initial value field can be variable, and the string size field can be used to indicate the number of associated residue fields. In one exemplary embodiment, data frame format 600B can be used to store compressed or encoded data, such as where real time processing of the data signal is not required.

Data frame format 500C includes an initial value field followed by separate fields for residue 1 through residue N, and an end of string field EOS to indicate that there are no additional residue field associated with the initial value field. In this exemplary embodiment, the number of residue fields for an associated initial value field may be variable, and the end of string field can be used to indicate the end of a series of associated residue fields. In one exemplary embodiment, data frame format 600C can be used to transmit compressed or encoded data, such as where real time processing of the data signal is required.

Data frame format 500D includes an initial value field followed by a string size field SS, a field that identifies the moduli being used MOD, and separate fields for residue 1 through residue N. In this exemplary embodiment, both the moduli that were used to compress the data and the number of residue fields for an associated initial value field can be variable, and the string size field can be used to indicate the number of associated residue fields. In one exemplary embodiment, data frame format 600D can be used to store compressed or encoded data, such as where real time processing of the data signal is not required, and where different moduli are dynamically selected as a function of the characteristics of the data that is being encoded or of the encryption requirements of the transmission.

In operation, the exemplary data frames shown in FIG. 5 provide examples of data frames that can be used in accordance with the present disclosure. These data frames include an initial value and a plurality of residue values that are used to decode at the receiving end associated successive data values. The data frames can also include data fields for defining the number of residue values associated with an initial value, the moduli used to generate the residue values, an end of string identifier sometimes referred to as EOS, or other suitable data, such as frame identifiers, frame sequence identifiers, or other identifiers.

Figure 6:
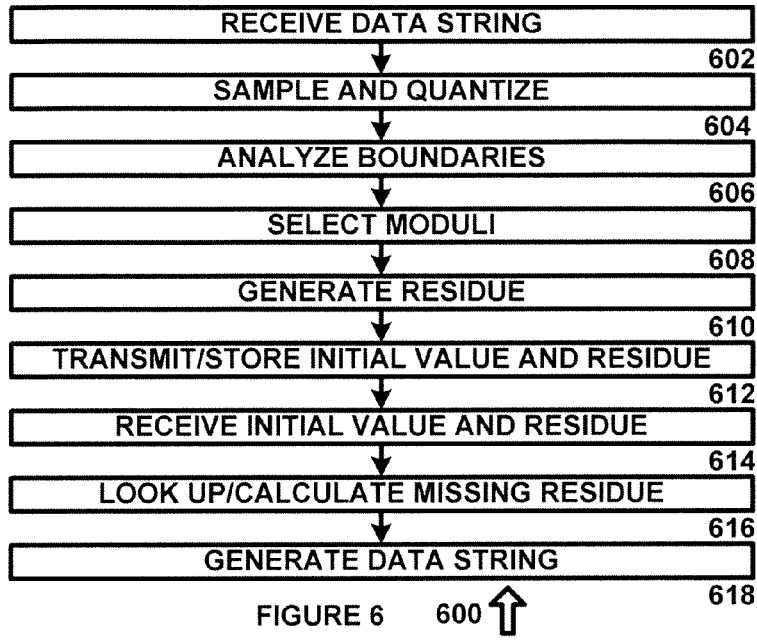
FIG. 6 is a flow chart of an algorithm for multi-residue multivariate encoding, in accordance with an exemplary embodiment of the present disclosure.

FIG. 6 is a flow chart of an algorithm 600 for multi-residue multivariate encoding, in accordance with an exemplary embodiment of the present disclosure. Algorithm 600 can be implemented in software operating on a processor platform, in hardware or in other suitable manners.

Algorithm 600 begins at 602, where a data string is received. In one exemplary embodiment, the data string can be extracted from an analog data signal such as an audio signal, from a digital data record such as a digital audio data stream, digital audiovisual data, a digital data file, digital telecommunications data, digital financial data, or other suitable data records. The algorithm then proceeds to 604.

At 604, the data string is sampled and quantized if the data is acquired in analog form. If the data is provided already quantized in digital format, only a reformatting algorithm may be required. In one exemplary embodiment, analog data can be sampled and quantized in a binary Pulse Code Modulated format, utilizing sample and hold circuits or other suitable processes for digitizing analog data. In another exemplary embodiment, digital data can be sampled by receiving a series of fields such as packets, frames, files or other suitable digital data structures. The algorithm then proceeds to 606.

At 606, the boundaries of the data string are analyzed, such as to determine the maximum and minimum values of the separate data fields with the data string. In one exemplary embodiment, the data string can be further analyzed to identify sections of the data string that have a predetermined low level of variability, such as where the difference between the maximum and minimum values is less than a predetermined value, and sections of the data string that have higher variability, such as for increasing levels of differences between the maximum and minimum values. The algorithm then proceeds to 608.

At 608, moduli are selected for use in a multi-residue multivariate encoding process. In one exemplary embodiment, the moduli can be selected based on the variability of the signal being encoded, based on the level of resolution required, or based on other suitable variables. The moduli can also be default moduli that are used for all signal processing of a certain nature such as audio .wav files or other audio, video or data standardized formats. The algorithm then proceeds to 610.

At 610, residues are generated for a sequence of data fields. In one exemplary embodiment, an initial data field is selected for use as an initial value field, and successive data fields are analyzed to generate the residue for a set of moduli, such as disclosed herein. The algorithm then proceeds to 612.

At 612, the initial value field and associated residue values are stored or transmitted. In one exemplary embodiment, the initial value field and associated residue values can be stored or transmitted using the data frame structures shown in FIG. 6 or other suitable data structures. The algorithm then proceeds to 614.

At 614, the initial value field and residue values are received, such as from a transmitted data stream using a receiver, by extracting data from a data storage medium, or in other suitable manners. The algorithm then proceeds to 616, where the residue values are used to look up the successive data field values following the initial value field data. In one exemplary embodiment, a look-up table can be used to determine the next data field value that has a closest value to the initial value field or previous data field value, in a look-up table that is generated in accordance with the exemplary procedures disclosed herein or in other suitable manners. The algorithm then proceeds to 618.

At 618, the original data string that was transmitted after being encoded is reproduced. In one exemplary embodiment, the data string can be reproduced by appending successive reconstructed data fields in the sequence that they were encoded. In another exemplary embodiment, data fields can be constructed in parallel, and the original data string can be reconstructed by sequencing the reconstructed data fields in accordance with a sequence number associated with each data field, or in other suitable manners. This is particularly feasible because multi-residue decoding may be carried out in independently operating decoders working in parallel.

In operation, algorithm 600 is used to encode/compress, optionally encrypt, and to decode/reconstruct data, in order to losslessly reduce the size of data storage or transmission bandwidth originally required for the data. Algorithm 600 utilizes a multi-residue multivariate encoding process to achieve lossless compression of data. Algorithm 600 can be performed sequentially or in parallel, can be performed following a sequential state machine taking advantage of shift registers and field programmable gate arrays or can be programmed following object oriented programming procedures in a general purpose processor, or can otherwise be modified or adapted to suit a specific software or hardware implementations.

Figure 7:
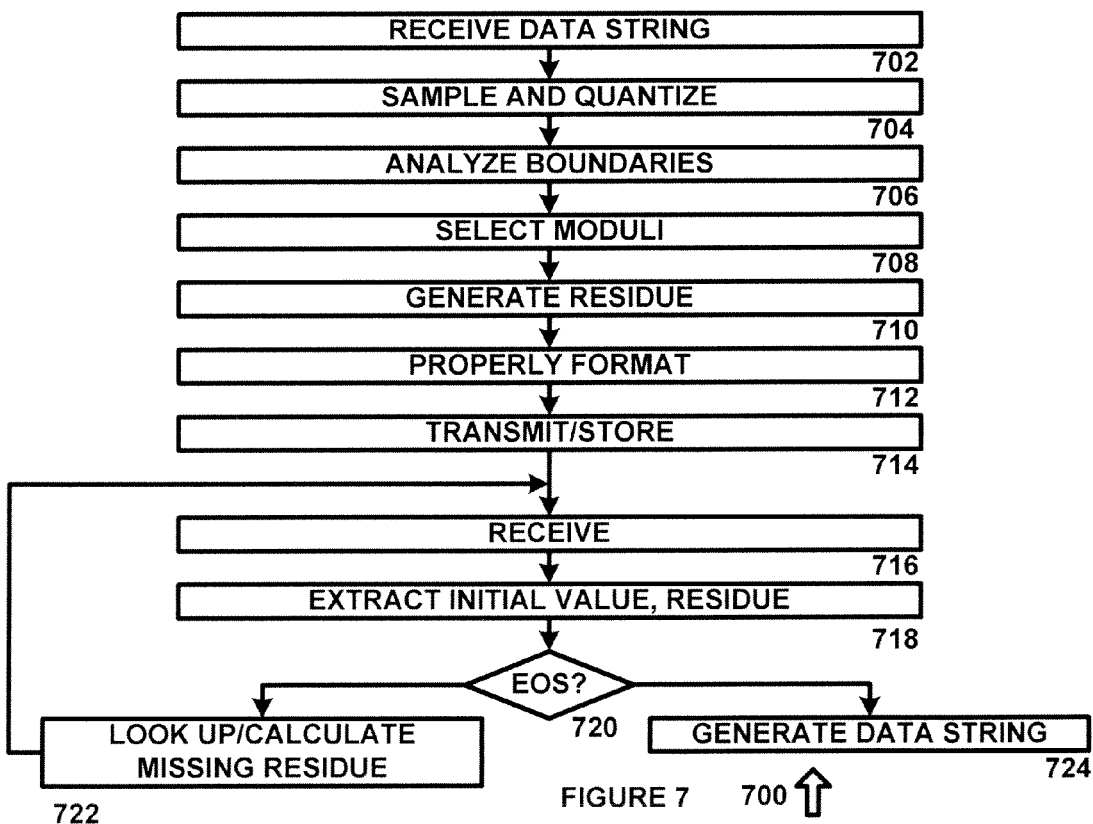
FIG. 7 is a flow chart of an algorithm for multi-residue multivariate encoding, in accordance with an exemplary embodiment of the present disclosure.

FIG. 7 is a flow chart of an algorithm 700 for multi-residue multivariate encoding, in accordance with an exemplary embodiment of the present disclosure. Algorithm 700 can be implemented in software operating on a processor platform, in hardware or in other suitable manners.

Algorithm 700 begins at 702 following to 710, which are the steps that are discussed above in regards to algorithm 700. At 712, the initial value field and residue fields are properly formatted, such as by generating a plurality of data packets having a data format such as those disclosed in FIG. 6. In another exemplary embodiment, the initial value field and residue fields are formatted by converting the data into a suitable transmission format for wireless data transmission, for optical data transmission, for storage in an optical media, for storage in a magnetic media, for storage in a silicon media, or using other suitable storage media in appropriate formats. The algorithm then proceeds to 714.

At 714, the properly formatted data is transmitted or stored, and the algorithm proceeds to 716 where the properly formatted data is subsequently received or extracted from data storage. In one exemplary embodiment, the properly formatted data can be received by a cellular telephone, a personal electronic device, a personal computer, a tablet computer, a laptop computer, a television set, an audio device, a facsimile machine, a printer, a financial processing system or by other suitable devices or systems. The algorithm then proceeds to 718.

At 718, the initial value data field and residue sets are extracted and analyzed. In one exemplary embodiment, the data can be analyzed to determine whether encrypted data fields are present, different audio, video or data are present, or there is an end of string data field, a moduli identifier field or fields, a frame sequence field, or other diverse nature of data. The algorithm then proceeds to 720.

At 720, it is determined whether an end of string field has been received or identified which is important if continuous messages are being sent. If an end of string field has not been received or identified, the algorithm proceeds to 722, where the missing residue value is determined by looking the value up in a data table, using a suitable algorithm such as the Chinese Remainder Theorem, or in other suitable manners. The associated data field is then determined and stored or transmitted for use in generating a reconstructed data string. The algorithm then returns to 716. If an end of string field has been received or identified at 720, the algorithm proceeds to 724, where the decoded or expanded data string is reconstructed by assembling each of the data fields in sequence, starting with the initial value and progressing with each subsequent reconstructed data field. However, it is not necessary to wait until the EOS is detected, such as where it is desirable and feasible to do the decoding and message reconstruction continuously as the information is received. The algorithm can also be repeated, if necessary, to reconstruct an entire data record in particular when error correcting codes are incorporated in noisy channels to increase the reliability of the transmission, or when the message is comprised of a plurality of data strings.

In operation, algorithm 700 is used to encode/compress and to decode/expand data, in order to losslessly reduce the data storage or transmission bandwidth requirements for the data. Algorithm 700 utilizes a multi-residue multivariate encoding process to achieve lossless compression of data with optional cryptographic encoding. Algorithm 700 can be performed in parallel, can be performed using a hardware sequential machine state diagram and/or object oriented programming algorithmic procedures, or can otherwise be modified or adapted to suit specific software or hardware implementations.

As discussed, communication of compressed data can be accomplished by transmitting a complete compressed file and decompressing it at the receiving end, by streaming compressed segments which are decompressed and assembling the segments back into a complete message at the receiving end, or in other suitable manners. It is possible to do both with modular coding, as discussed.

One advantage of streaming the data over transmitting it continuously is particularly important in the field of entertainment where immediate playback upon request is desirable. However, streaming may require buffering of the information segments to ameliorate erratic playback, such as due to delays in data transmission. It is therefore somewhat more complex than encoded file transmission, which required a larger amount of storage available for this function. In general, compressed text files are more suitable for the latter approach.

Modular encoding is suitable for either one of these approaches with very similar algorithms, which are suitable for a compressor/decompressor hardware or software systems. In one exemplary embodiment, a client/server configuration can be used to transmit and receive data over the Internet. The server can limit access only to IP addresses that are subscribed to it for information services, can be used to a receiver that requests access in a compressed format for which decompressing algorithms implemented in software or hardware are available, or can perform other suitable functions.

The server can store the information database and respond to requests that by providing compressed data for efficiency of bandwidth use. For example, a collection of musical pieces, one example used in the code below, can be used to provide a rendition of "Fur Elise" with a 75% reduction in data and with no perceptible loss in quality. Depending on whether the original signal is encoded in a special format or not, a lossless modular approach, although with gains in compression not as dramatic as a lossy one, may be imposed on an already compressed item. This can be done up to a point and varies according to the previous compression.

The server in this exemplary embodiment can be addressed by a four part IP address, and accessed using the TCPIP approach known as socket connectivity, where the present disclosure can be used to provide a modular compression encoding. A tabular approach allows a table to be pre-computed and stored with a sufficiently large moduli for general use or to be computed on the fly (as in the exemplary embodiments) to suit the size of the potential compression. In one exemplary embodiment, floating point samples range from +1 to −1 using a 16-bit signed digit approach with a range of 32 bits implicit. This range can be reduced to 8 unsigned bits with a root mean square error of 0.03 percentile due to round off. A more strict lossless result would be possible if the approach were made using the native mode of the bit representation of the samples.

The complexity of the streaming approach in the decompressing client side can stem from the variations that are experienced in the arrival time of the segments, such as due to transmission over the Internet or for other reasons. Exemplary annotated code in Matlab for a compressing server is shown below.

```
%clear all
close all
clc
%Database of music files stored in server in compressed format
%and played back at client upon request. In this instance, the
%compression demonstrates the dynamics of the operation
[f1,fs,nsb]=wavread('furelise');
%Parameters are chosen to accept a variety of sampling
%resolutions
M2=int32(2^(nsb/2));           %rows of a table of equal distances
M1=int32(2^(nsb/2)−1);         %columns of the same table;
M =int32([M1,M2]);
MM=M(1)*M(2);
%'lifting' of the signal to make it strictly positive
p2p = abs(min(f1));
%If using integers, lossless transfer can be accomplished
%but to demonstrate feasibility of streaming,
%use a 0.03 percent rms error, due to round-off when multiplying
%the +1 to −1 v signal by this factor.
mult=125;
dat1 = round((f1 + p2p).*mult );
%Following is the preliminary to the encoding and computer TCPIP
%communications via sockets, for streaming feasibility demo
dat2=int32(dat1);
%---Encoding--------
Isen= uint8(mod(dat2, M(2)));
[m1,n]=size(Isen);
    data = Isen(:);
    s = whos('data');
    s.size
    s.bytes
%This is the transmission and connection software
tcpipServer=tcpip('96.226.212.59',55000,'NetworkRole','Server');
    set(tcpipServer,'OutputBufferSize',s.bytes);
    fopen(tcpipServer);
    fwrite(tcpipServer,data(:),'uint8');
    fclose(tcpipServer);
    pause(1)
```

Two important things occur at the client side where the user is. First, a request is originated from the client to the server for compressed information, and second, when that request is honored with a compressed stream or file, the client reads it and decompresses for its use.

The decompressing operation is based on the same principles outlined earlier for shorter pieces of audio but applicable in general to either files or streams. A search method can be used that is more general and more adaptable regardless of the resolution of the signal by changing the moduli on which the table is based. An exemplary embodiment of the client code includes a player for the musical piece, as shown below:

```
clear all
close all
clc
rawData=zeros(1,361000);
tcpipClient=tcpip('192.168.1.12',55000,'NetworkRole','Client');
    set(tcpipClient,'InputBufferSize', 361000);
    set(tcpipClient,'Timeout',30);
    fopen(tcpipClient);
    rawData(1,:)= (fread(tcpipClient,361000,'uint8'));
[m,n]=size(rawData );
L=m*n;
Irec=reshape(rawData,L,1);
Irec=Irec(1:361000);
%data and parameters can be stored or received in advance
%File f1 can be used to determine the error
F='furelise';
[f1 fs nsb] = wavread(F);%data supposed to come from outside
mult=125;
p2p = abs(min(f1));
M2=int32(2^(nsb/2));%rows of a table of equal distances
M1=int32(2^(nsb/2)−1);%columns of the same table;
M =int32([M1,M2]);
MM=M(1)*M(2);
```

-continued

```
%Two dimensional table which is to be used to decompress the
%compressed file requested from server by client software
twoD(1,1)=0;
for i=2:M(1)
twoD(i,1)=mod(twoD(i−1,1)+M(2),MM);
end
col=1;
for i=2:M(2)
        twoD(1,col+1)=mod((twoD(M(1),col)+1),MM);
        for j=2:M(1)
    twoD(j,i)=mod((twoD(j−1,i)+M(2)), MM);
        end
    col=col+1;
    end
%If same table is to be used it can be stored and loaded faster
twoD = int32(twoD);
%Preliminary to the decoding
dLen = length(Irec);
y_out(1) =int32( Irec(1));
%The decoding loop
for id =2:dLen
col_IDX(id) = Irec(id)+1;
[~,row_IDX(id)] = min(abs(y_out(id−1)−twoD(:,col_IDX(id))));
y_out(id) = twoD(row_IDX(id),col_IDX(id));
end
y_out=double(y_out);
%y_out id the decoded file
%Convert (augmented) decoded signal to limits of original signal
y_out = (y_out−p2p)./mult;
y_out=y_out−y_out(1);
%Now here this
sound(y_out,fs)
y_out =( y_out(1:361000)');
%This is only to estimate error
e = y_out(2:end)−f1(2:end);
%The rms of the error is calculated and shown graphically
figure
plot(e)
err_rms = sqrt((sum(e.^2))/length(e));
fprintf('\nrms is %f', err_rms);
fprintf('\n');
%The compression achieved in the transfer is given below
compression=(length(Irec)*8)/(length(f1)*32)
%"single" floating point representation or half for an integer
%sixteen bit signed representation.
%-----------------------Figures-----------------------%
%---Plotting input and output signals;
%------------Plotting--------------
figure
subplot(2,1,1)
plot(f1)
title('Input signal: TIMIT sentence ');
xlabel('No of samples')
ylabel('Amplitude')
subplot(2,1,2)
plot (y_out)
xlabel('Sample number')
ylabel('Amplitude')
%title(['Output obtained with RMS error = ',num2str(err_rms)])
ylabel('Error in decoded sample ')
xlabel('Original signal sample number')
```

As shown, the modular compression approach can be used in file and streaming communications. The principles of this approach do not depend on the nature of the information content of the communication.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. A method for encoding data to achieve compression, comprising:

generating a multi-residue multivariate encoding table having N moduli with a processor, where N is a positive integer equal to two or more, where each of a plurality of integers has a unique set of residue values associated with the moduli;

storing a first data field value of a sequence of L data fields values, where L is an integer equal to or greater than 2;

storing a set of K residue values for each of the successive L−1 data field values of the sequence of L data field values in a non-transient data storage medium until a set of K residue values for each successive data field value have been stored;

retrieving the first data field value and the L−1 sets of K residue values from the non-transient data storage medium; and reconstructing the sequence of L data fields with a processor that uses the multi-residue multivariate encoding table and a table look-up process, using the first value and the L−1 sets of K residue values.

2. The method of claim 1 wherein storing or transmitting the first data field of the sequence of L data fields comprises storing the first data field in a data frame.

3. The method of claim 2 wherein storing the set of K residue values for each of the successive L−1 data fields of the sequence of the plurality of data fields comprises storing or transmitting the sets of K residue values in the data frame.

4. The method of claim 1 further comprising storing an end of field value in a data frame.

5. The method of claim 1 further comprising storing a string size field in a data frame.

6. The method of claim 1 further comprising storing a set of moduli values in a data frame at the decoding process either from storage or transmission, prior to the storage or transmission process.

7. The method of claim 1 wherein reconstructing the sequence of L data fields comprises:

finding a column associated with the set of K residue values for the second successive data field; and selecting a value stored in the column that is closest to the first data field value as the second data field value.

8. The method of claim 7 further comprising:

finding a column associated with the set of K residue values for the next successive data field; and selecting a value stored in the column that is closest to the last selected data field value as the next data field value.

9. A system for encoding data comprising:

a processor;

a moduli-based coder system configured to generate a multi-residue multivariate encoding table having N moduli with a processor, where N is a positive integer equal to two or more, where each of a plurality of integers has a unique set of residue values associated with the moduli;

a data storage system configured to store a first data field value of a sequence of L data fields values, where L is an integer equal to or greater than 2;

the data storage system is configured to store a set of K residue values for each of successive L−1 data field values of the sequence of L data field values in a non-transient data storage medium until a set of K residue values for each successive data field value have been stored;

a data receiver system configured to retrieve the first data field value and the L−1 sets of K residue values from the non-transient data storage medium; and a residue calculation system configured to reconstruct the sequence of M data fields with the processor that uses the multi-residue multivariate encoding table and a table look-up process, using the first value and the L−1 sets of K residue values.

10. The system of claim 9 further comprising a signal boundary analyzer configured to analyze the sequence of L data field values to determine a data range of amplitudes representing a difference between a maximum and a minimum value of the data field values of the sequence of L data field values.

11. The system of claim 10 further comprising a moduli selector system configured to select the N moduli as a function of the data range.

12. The system of claim 9 wherein the data storage system is configured to store the first data field of the sequence of M data fields in a data frame.

13. The system of claim 12 wherein the data storage system is configured to store the sets of N−1 residue values in the data frame.

14. The system of claim 9 wherein the data storage system is configured to store an end of field value in a data frame.

15. The system of claim 9 wherein the data storage system is configured to store a string size field in a data frame.

16. The system of claim 9 wherein the data storage system is configured to store a moduli value in a data frame.

17. An apparatus for encoding data comprising:
a processor;
means for generating a multi-residue multivariate encoding table having N moduli, where N is a positive integer equal to two or more, where each of a plurality of integers has a unique set of residue values associated with the moduli;
means for storing a first data field value of a sequence of M data fields values, where L is an integer equal to or greater than 2;
means for storing a set of K residue values for each of the successive L−1 data field values of the sequence of L data field values in a non-transient data storage medium until a set of K residue values for each successive data field value have been stored;
means for retrieving the first data field value and the L−1 sets of K residue values from the non-transient data storage medium; and means for reconstructing the sequence of L data fields using the multi-residue multivariate encoding table and a table look-up process, using the first value and the L−1 sets of K residue values.

18. The apparatus of claim 17 comprising means for storing or transmitting the first data field in a data frame.

19. The apparatus of claim 17 comprising means for storing or transmitting the sets of K residue values in the data frame.

20. The apparatus of claim 17 further comprising means for storing an end of field value in a data frame.

* * * * *